US012562518B2

(12) United States Patent
Yamada et al.

(10) Patent No.: US 12,562,518 B2
(45) Date of Patent: Feb. 24, 2026

(54) FLEXIBLE PRINTED CIRCUIT CONNECTION STRUCTURE

(71) Applicant: MEKTEC CORPORATION, Tokyo (JP)

(72) Inventors: Shuzo Yamada, Tokyo (JP); Kenichi Nakayama, Tokyo (JP); Tomoki Kanayama, Tokyo (JP)

(73) Assignee: MEKTEC CORPORATION, Tokyo (JP)

( * ) Notice: Subject to any disclaimer, the term of this patent is extended or adjusted under 35 U.S.C. 154(b) by 187 days.

(21) Appl. No.: 18/481,982

(22) Filed: Oct. 5, 2023

(65) Prior Publication Data

US 2024/0136740 A1  Apr. 25, 2024
US 2024/0235072 A9  Jul. 11, 2024

(30) Foreign Application Priority Data

Oct. 19, 2022  (JP) ................................. 2022-167446

(51) Int. Cl.
*H05K 1/11*  (2006.01)
*H01R 12/61*  (2011.01)
(52) U.S. Cl.
CPC ............. *H01R 12/61* (2013.01); *H05K 1/118* (2013.01); *H05K 2201/09381* (2013.01); *H05K 2201/09781* (2013.01)
(58) Field of Classification Search
CPC .. H05K 1/0221; H05K 1/0393; H05K 1/0277; H05K 1/147; H05K 1/189; H05K 1/0219; H05K 1/0222; H05K 2201/09427; H05K 2201/2036; H01R 12/59–62
See application file for complete search history.

(56) References Cited

U.S. PATENT DOCUMENTS

| | | | | | |
|---|---|---|---|---|---|
| 7,448,923 | B2 * | 11/2008 | Uka | ................... | H01R 43/0249 |
| | | | | | 439/876 |
| 2003/0116776 | A1 * | 6/2003 | Oppermann | ......... | H05K 1/0219 |
| | | | | | 257/100 |
| 2007/0221403 | A1 * | 9/2007 | Chou | ..................... | H01R 12/52 |
| | | | | | 174/262 |
| 2014/0355228 | A1 * | 12/2014 | Shi | ......................... | H05K 3/363 |
| | | | | | 361/803 |
| 2020/0194859 | A1 * | 6/2020 | Araki | ..................... | H05K 1/111 |
| 2021/0092832 | A1 | 3/2021 | Tonaru | | |

FOREIGN PATENT DOCUMENTS

| | | | |
|---|---|---|---|
| JP | 5344018 | B2 | 11/2013 |
| JP | 7078113 | B2 | 5/2022 |

* cited by examiner

*Primary Examiner* — Roshn K Varghese
(74) *Attorney, Agent, or Firm* — Studebaker Brackett PLLC

(57) ABSTRACT

Provided is a flexible printed circuit connection structure which includes a flexible printed circuit having a plurality of wires, a board to be connected having a plurality of wires to be connected, a plurality of solder connection portions, and a partition wall, in which: the plurality of solder connection portions is a part where the plurality of wires of the flexible printed circuit and the plurality of wires to be connected of the board to be connected are connected to each other by solder; the partition wall is provided away from the plurality of solder connection portions so as to surround the plurality of solder connection portions; and the flexible printed circuit, the board to be connected, and the partition wall define a sealed space, and the plurality of solder connection portions is arranged inside the sealed space.

7 Claims, 7 Drawing Sheets

FLEXIBLE PRINTED CIRCUIT CONNECTION STRUCTURE

CROSS-REFERENCE TO RELATED APPLICATION

This application claims priority from Japanese Patent Application No. 2022-167446 filed with the Japan Patent Office on Oct. 19, 2022, the entire content of which is hereby incorporated by reference.

BACKGROUND

1. Technical Field

The present disclosure relates to a flexible printed circuit connection structure.

2. Related Art

In a flexible printed circuit (hereinafter, referred to as "FPC") used as a circuit board, there is a limit to increasing a longitudinal dimension of the FPC by using only one FPC due to its manufacturing process. Therefore, a plurality of FPCs is connected to increase the entire length of the FPCs. The FPC is sometimes used by being connected to another circuit board such as a rigid circuit board (see, for example, Japanese Patent No. 5344018 and Japanese Patent No. 7078113). In a case where the FPCs are connected to each other and in a case where the FPC is connected to another circuit board, wires are generally connected by solder (in the following description, a part where wires are connected by solder as described above will also be referred to as a solder connection portion). In a case where a distance between adjacent solder connection portions is short, it is necessary to take a measure to prevent short circuits caused by condensation or the like. Although various measures have conventionally been taken to prevent short circuits caused by condensation or the like, there is still room for improvement, for example, strength thereof is not sufficient.

SUMMARY

A flexible printed circuit connection structure according to an embodiment of the present disclosure includes a flexible printed circuit having a plurality of wires, a board to be connected having a plurality of wires to be connected, a plurality of solder connection portions, and a partition wall, in which: the plurality of solder connection portions is a part where the plurality of wires of the flexible printed circuit and the plurality of wires to be connected of the board to be connected are connected to each other by solder; the partition wall is provided away from the plurality of solder connection portions so as to surround the plurality of solder connection portions; and the flexible printed circuit, the board to be connected, and the partition wall define a sealed space, and the plurality of solder connection portions is arranged inside the sealed space.

DETAILED DESCRIPTION

Figure 1:
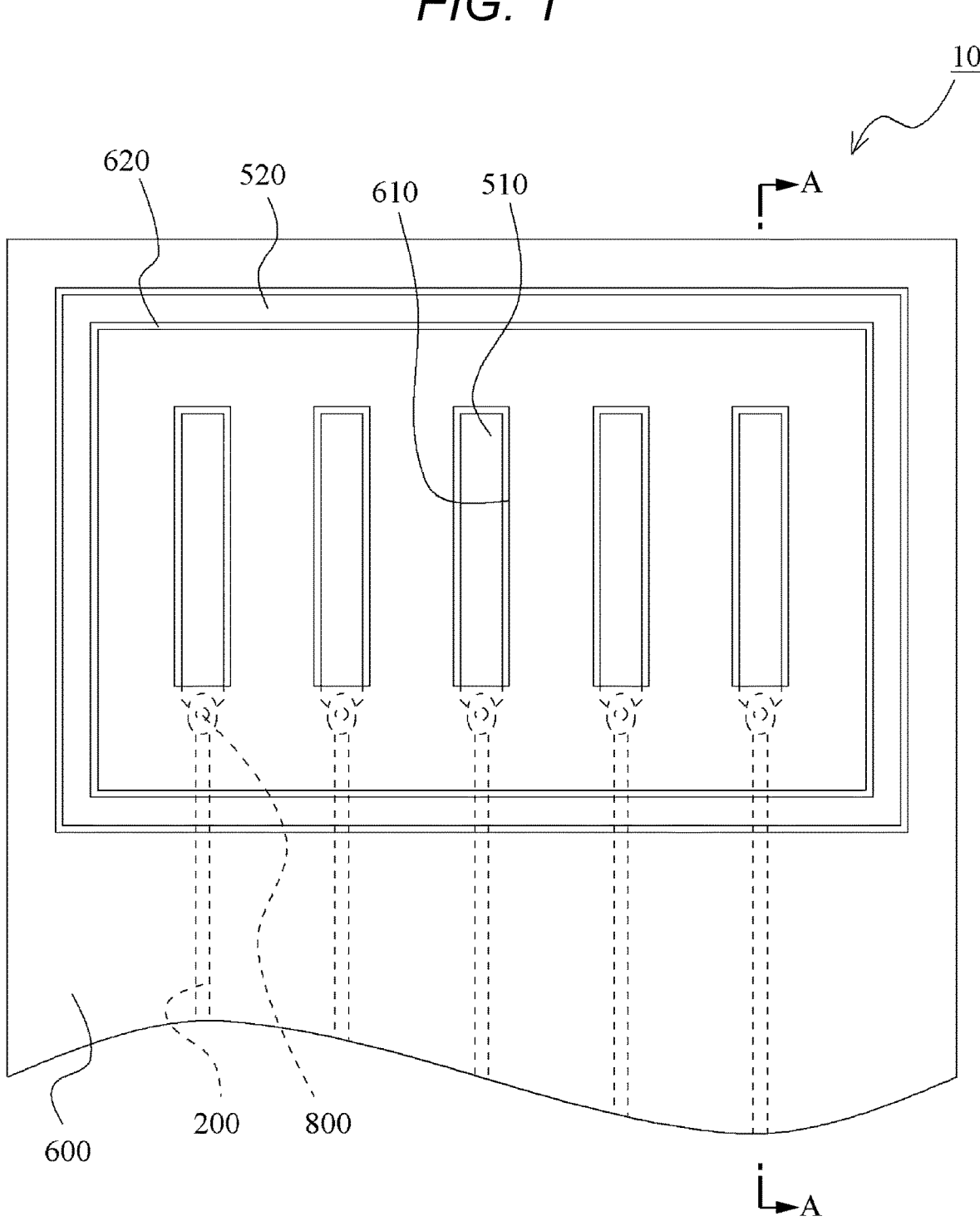
FIG. 1 is a schematic configuration diagram of a flexible printed circuit according to a first embodiment of the present disclosure.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

An object of the present disclosure is to provide a flexible printed circuit connection structure capable of preventing short circuits caused by condensation while preventing force to pull off a solder connection portion from being applied to the solder connection portion.

The present disclosure adopts the following measures to solve the above problem.

A flexible printed circuit connection structure according to an aspect of the present disclosure includes a flexible printed circuit having a plurality of wires, a board to be connected having a plurality of wires to be connected, a plurality of solder connection portions, and a partition wall, in which: the plurality of solder connection portions is a part where the plurality of wires of the flexible printed circuit and the plurality of wires to be connected of the board to be connected are connected to each other by solder; the partition wall is provided away from the plurality of solder connection portions so as to surround the plurality of solder connection portions; and the flexible printed circuit, the board to be connected, and the partition wall define a sealed space, and the plurality of solder connection portions is arranged inside the sealed space.

According to the present disclosure, the plurality of solder connection portions is arranged in the sealed space, and thus it is possible to prevent short circuits between the wires caused by condensation or the like. Further, the partition wall is provided away from the plurality of solder connection portions so as to surround the plurality of solder connection portions. Therefore, even if the force to pull off the solder connection portions is applied from any direction, the force is applied to the partition wall before being applied to the solder connection portions. This makes it possible to prevent the force to pull off the solder connection portions from being applied to the solder connection portions.

It is preferred that the partition wall is made from solder.

Therefore, it is possible to provide the partition wall at the same time as work of connecting the plurality of wires to be connected to the plurality of wires provided on the flexible printed circuit by solder. Further, it is possible to increase strength of the partition wall. This makes it possible to more reliably prevent the force to pull off the solder connection portions from being applied to the solder connection portions.

It is preferred that the flexible printed circuit includes a base film, a plurality of first conductor portions arranged on a first surface side of the base film, and a plurality of second conductor portions arranged on a second surface side of the base film; the plurality of first conductor portions and the plurality of second conductor portions are connected to each other via through holes; each of the plurality of wires of the flexible printed circuit is formed by the first conductor portion, the through hole, and the second conductor portion; the plurality of second conductor portions and the plurality of wires to be connected of the board to be connected are connected to each other by solder; and the partition wall is provided on the second surface side of the base film.

By adopting the above configuration, it is possible to prevent conduction between the plurality of wires and the partition wall even if the partition wall is made from solder that is a conductor.

The partition wall may be formed by an adhesive or double-sided tape.

It is preferred that inside of the sealed space is filled with underfill resin.

This makes it possible to more reliably prevent short circuits between adjacent wires.

Note that the above configurations may be adopted in combination when possible.

As described above, the present disclosure can prevent short circuits caused by condensation while preventing the force to pull off the solder connection portions from being applied to the solder connection portions.

Hereinafter, embodiments of the present disclosure will be exemplarily described in detail with reference to the drawings. Note that dimensions, materials, shapes, and relative arrangements of components described in the embodiments do not restrict the scope of the present disclosure, unless otherwise specified. A connection structure of flexible printed circuits (hereinafter, referred to as "FPCs") described below is suitably applicable to battery monitoring modules of EVs and PHVs in automobiles. However, the connection structure in the embodiments of the present disclosure can be adopted for various applications.

(First Embodiment)

Figure 2:
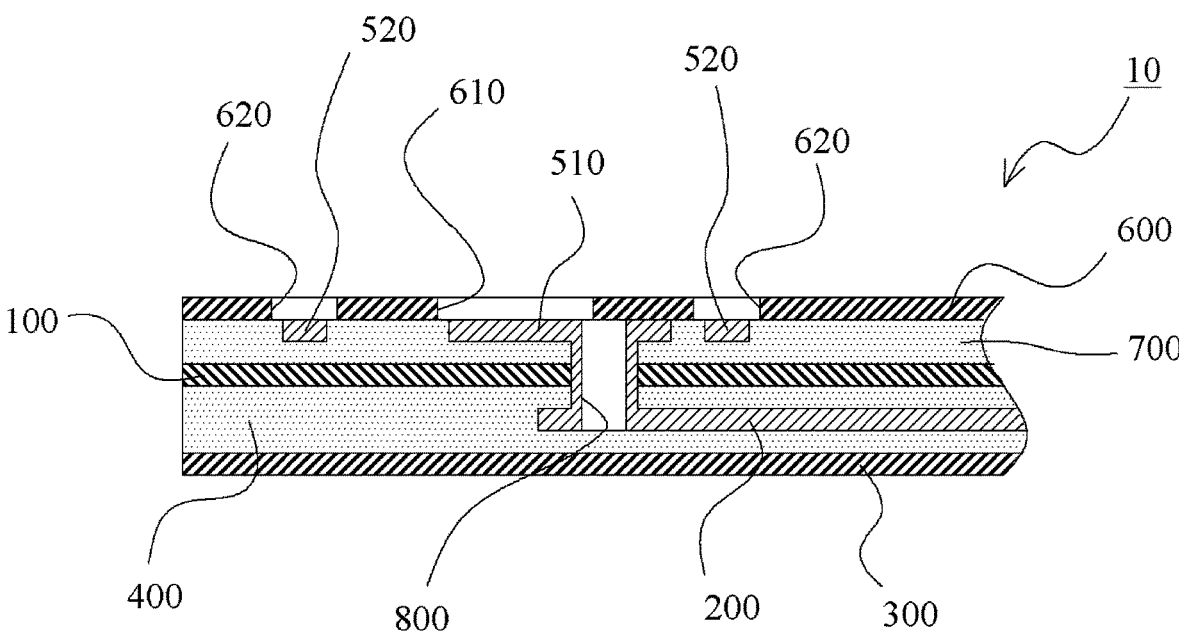
FIG. 2 is a schematic configuration diagram of the flexible printed circuit according to the first embodiment of the present disclosure.
Figure 3:
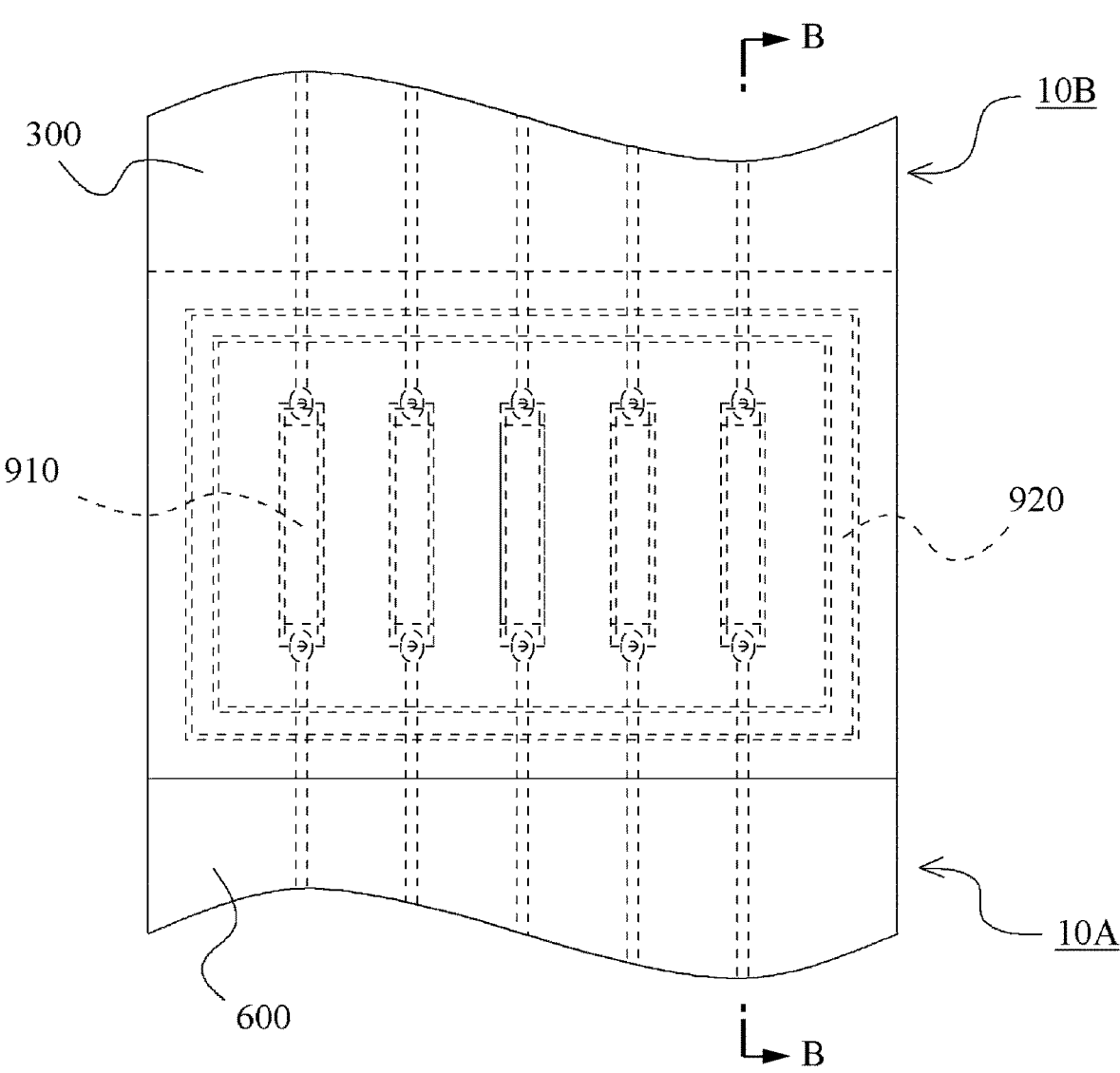
FIG. 3 is a schematic configuration diagram of a flexible printed circuit connection structure according to the first embodiment of the present disclosure.
Figure 4:
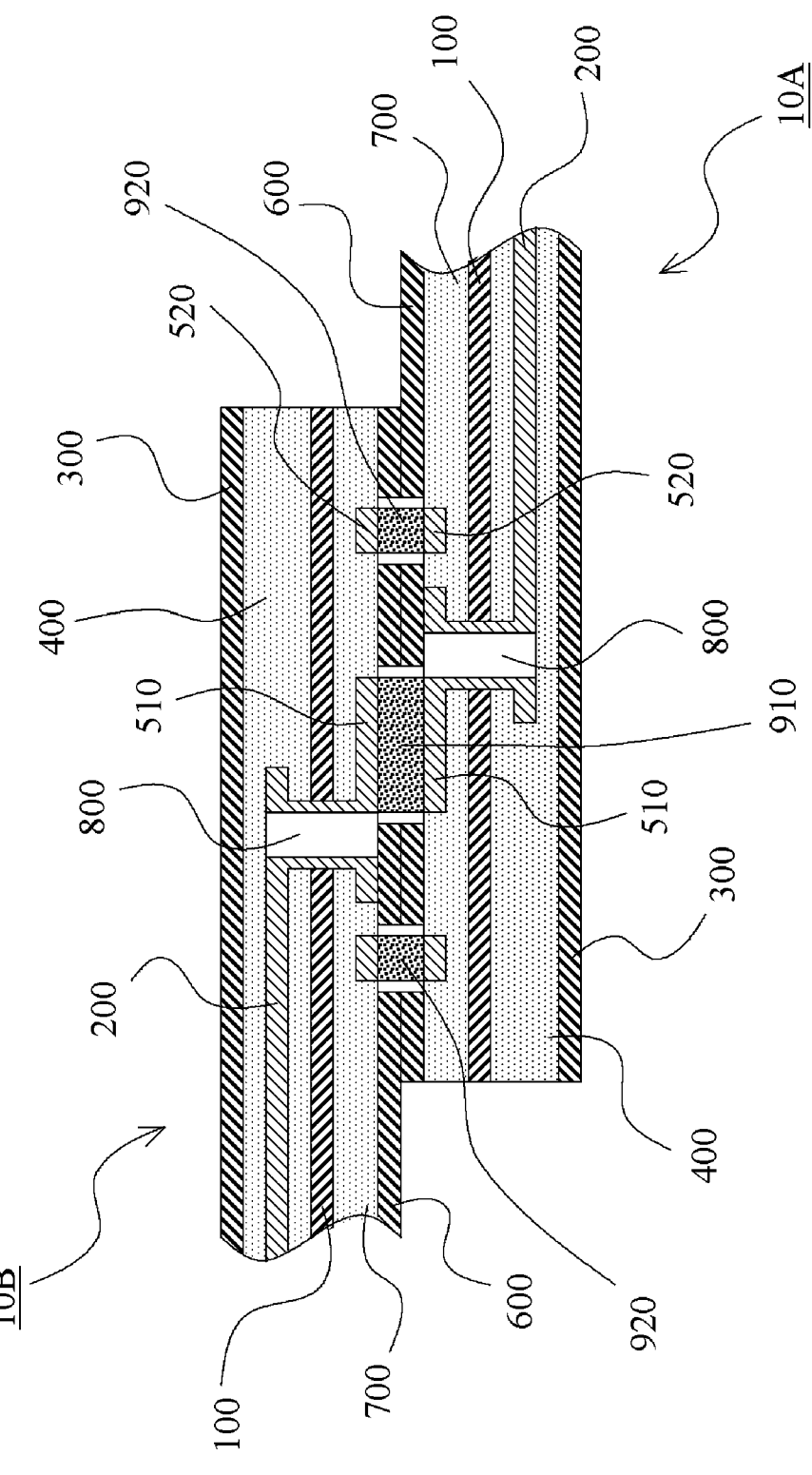
FIG. 4 is a schematic configuration diagram of the flexible printed circuit connection structure according to the first embodiment of the present disclosure.

A connection structure of FPCs 10 according to a first embodiment of the present disclosure will be described with reference to FIGS. 1 to 4. FIGS. 1 and 2 are schematic configuration diagrams of the FPC 10 according to the first embodiment of the present disclosure. FIG. 1 is a part of a plan view of the FPC 10, and FIG. 2 is a cross-sectional view taken along the line AA of FIG. 1. FIGS. 3 and 4 are schematic configuration diagrams of the connection structure of the FPCs 10 according to the first embodiment of the present disclosure. FIG. 3 is a part of a plan view of the connection structure of the FPCs 10, and FIG. 4 is a cross-sectional view taken along the line BB of FIG. 3. In the drawings, main components are illustrated in perspective with dotted lines.

<FPC10>

The FPC 10 includes a base film 100, a plurality of first conductor portions 200 arranged on one surface side (first surface side) of the base film 100, and a first coverlay 300 that protects the plurality of first conductor portions 200. The first coverlay 300 is connected to the first conductor portions 200 and the base film 100 by an adhesive layer 400. Note that the desired first conductor portions 200 are formed by etching a metallic foil such as a copper foil.

The FPC 10 according to this embodiment also includes a plurality of second conductor portions 510 and a third conductor portion 520 arranged on the other surface side (second surface side) of the base film 100 and a second coverlay 600. The second coverlay 600 is connected to the base film 100 by an adhesive layer 700. Note that the desired second conductor portions 510 and third conductor portion 520 are formed by etching a metallic foil such as a copper foil. The plurality of first conductor portions 200 extend in a longitudinal direction of the FPC 10. The plurality of first conductor portions 200 and the plurality of second conductor portions 510 are connected to each other via through holes 800. The first conductor portions 200, the through holes 800, and the second conductor portions 510 form wires of the FPC 10. The FPC 10 includes a plurality of wires each formed by the first conductor portion 200, the through hole 800, and the second conductor portion 510. In FIG. 1, five wires are provided.

The second coverlay 600 includes openings 610 for exposing a part of each of the plurality of second conductor portions 510. The second coverlay 600 also includes openings 620 for exposing the third conductor portion 520.

Note that the base film 100, the first coverlay 300, and the second coverlay 600 can be made from polyimide, polyethylene naphthalate, and polyethylene terephthalate, and the like.

<Connection Structure of FPCs 10>

A method of increasing the length by connecting the plurality of FPCs 10 formed as described above will be described. Here, for convenience, two FPCs to be connected will be referred to as a first FPC 10A and a second FPC 10B. Note that the first FPC 10A and the second FPC 10B have at least the same configuration related to connecting (configuration in FIGS. 1 and 2), and the second and third conductor portions 510 and 520 have the same arrangement and width dimensions, and the openings 610 and 620 have the same arrangement and dimensional shapes.

First, for example, solder paste is applied to each exposed portion of the plurality of second conductor portions 510 and the third conductor portion 520 in the first FPC 10A. Then, the first FPC 10A and the second FPC 10B are overlaid on each other such that each exposed portion of the plurality of second conductor portions 510 and the third conductor portion 520 in the first FPC 10A is placed on each exposed portion of the plurality of second conductor portions 510 and the third conductor portion 520 in the second FPC 10B (see FIG. 3). Thereafter, the first FPC 10A and the second FPC 10B are soldered by being heated while being applied with pressure by a heater tool. Note that soldering may be so-called reflow soldering that is performed by heating a soldering portion in a reflow oven while applying pressure to the soldering portion by using a load applying jig. Therefore, the plurality of second conductor portions 510 in the first FPC 10A and the plurality of second conductor portions 510 in the second FPC 10B are connected to each other by solder 910 (see FIG. 4). At the same time, the third conductor portion 520 in the first FPC 10A and the third conductor portion 520 in the second FPC 10B are connected to each other by solder, thereby providing a partition wall 920 made from solder.

The partition wall 920 is provided away from a plurality of solder connection portions where a plurality of wires to be connected (one of the wires of the first FPC 10A and the second FPC 10B in this embodiment) and a plurality of wires (the other of the wires of the first FPC 10A and the second FPC 10B in this embodiment) are connected to each other by the solder 910 so as to surround the plurality of solder connection portions (see FIG. 3). In this embodiment, the solder connection portions correspond to parts where the second conductor portions 510 in the first FPC 10A and the second conductor portions 510 in the second FPC 10B are connected by the solder 910. Further, a board to be connected (one of the first FPC 10A and the second FPC 10B in this embodiment), an FPC (the other of the first FPC 10A and the second FPC 10B in this embodiment), and the partition wall 920 define a sealed space in which the plurality of solder connection portions is arranged (see FIGS. 3 and 4).

The partition wall 920 made from solder is provided on the other surface side (second surface side) of the base film 100. The other surface side (second surface side) of the base film 100 is opposite to the one surface side (first surface side) of the base film 100 on which the first conductor portions 200 are provided. The partition wall 920 is separated from the plurality of second conductor portions 510 provided on the other surface side (second surface side) of the base film 100. Therefore, the above plurality of wires and the above plurality of wires to be connected are insulated from the partition wall 920.

<Excellent Points of FPC Connection Structure in This Embodiment>

In the FPC connection structure according to this embodiment, the plurality of solder connection portions is arranged in the sealed space, and thus it is possible to prevent short circuits between the wires caused by condensation or the like. For example, in a case where the FPC connection structure is used for a battery monitoring module, the FPCs are exposed to an environment in which condensation tends to occur. However, by adopting the connection structure according to this embodiment, it is possible to effectively prevent short circuits between the wires. This point will be described with reference to FIG. 5.

Figure 5:
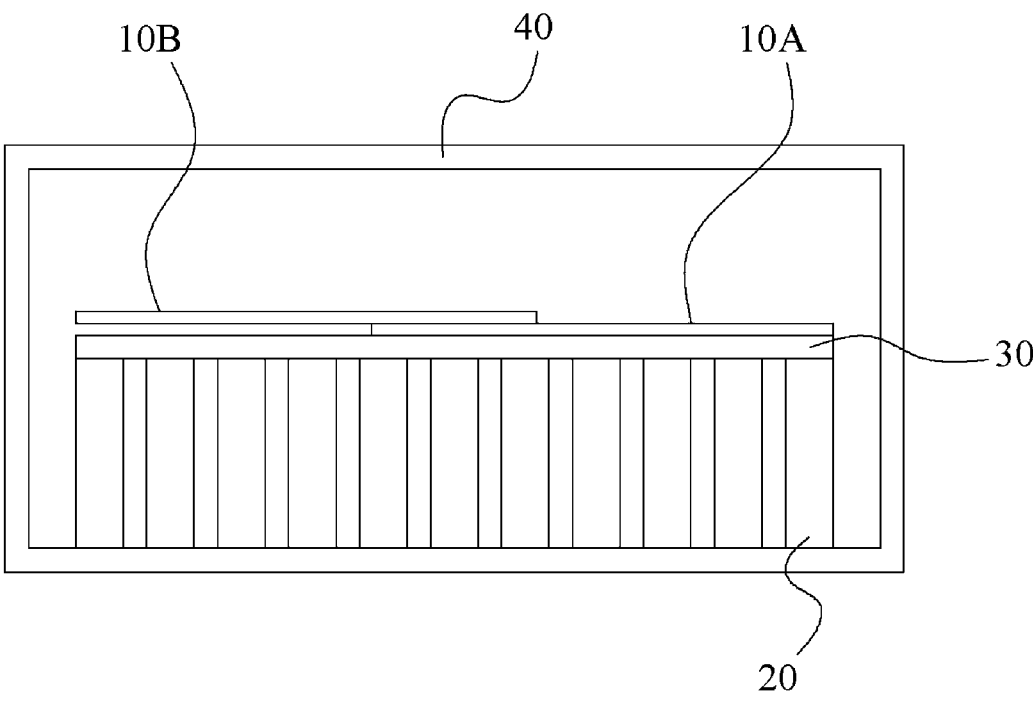
FIG. 5 illustrates an application example of the flexible printed circuit connection structure according to the first embodiment of the present disclosure.

FIG. 5 illustrates an application example of the FPC connection structure according to the first embodiment of the present disclosure and simply illustrates a case where the FPCs are used as a battery monitoring module. A battery used in an EV or PHV of an automobile includes a plurality of cells 20. In order to constantly monitor whether or not the plurality of cells 20 is normal, the battery monitoring module is attached on the top of the plurality of cells 20. The battery monitoring module includes the first FPC 10A, the second FPC 10B, and a plate 30 that supports the first FPC 10A and the second FPC 10B and is fixed to the plurality of cells 20. The plurality of cells 20 and the battery monitoring module are housed in a case 40. The battery monitoring module is a known technology, and thus detailed description thereof is omitted.

According to the configuration in FIG. 5, a temperature inside the case 40 rises when the battery is used, and thus a temperature difference between the inside and the outside of the case 40 increases. As a result, condensation tends to occur inside the case 40. However, by adopting the FPC connection structure according to this embodiment, it is possible to prevent water droplets or the like caused by condensation from adhering to the solder connection portions. Further, the plurality of solder connection portions is arranged in the narrow sealed space, and the FPCs are in contact with the cells 20, and thus a temperature difference between the inside and the outside of the sealed space is hardly generated. Therefore, condensation hardly occurs in the sealed space. The same applies to a situation in which the temperature decreases after the battery is stopped.

The partition wall 920 is provided away from the plurality of solder connection portions so as to surround the plurality of solder connection portions. Therefore, even if the force to pull off the solder connection portions is applied from any direction, the force is applied to the partition wall 920 before being applied to the solder connection portions. This makes it possible to prevent the force to pull off the solder connection portions from being applied to the solder connection portions.

Because the partition wall 920 according to this embodiment is made from solder, the strength of the partition wall 920 can be increased. This makes it possible to more reliably prevent the force to pull off the solder connection portions from being applied to the solder connection portions.

Further, because the partition wall 920 is made from solder, it is possible to provide the partition wall 920 at the same time as work of connecting the plurality of wires to be connected to the plurality of wires provided on the FPC 10 by solder.

(Second Embodiment)

FIG. 6 illustrate a second embodiment of the present disclosure. In this embodiment, the inside of the sealed space is filled with resin (underfill resin), as compared to the configuration of the first embodiment. The other configurations and effects are the same as those of the first embodiment, and thus the same components are denoted by the same reference signs, and description thereof is omitted.

Figures 6A, 6B:
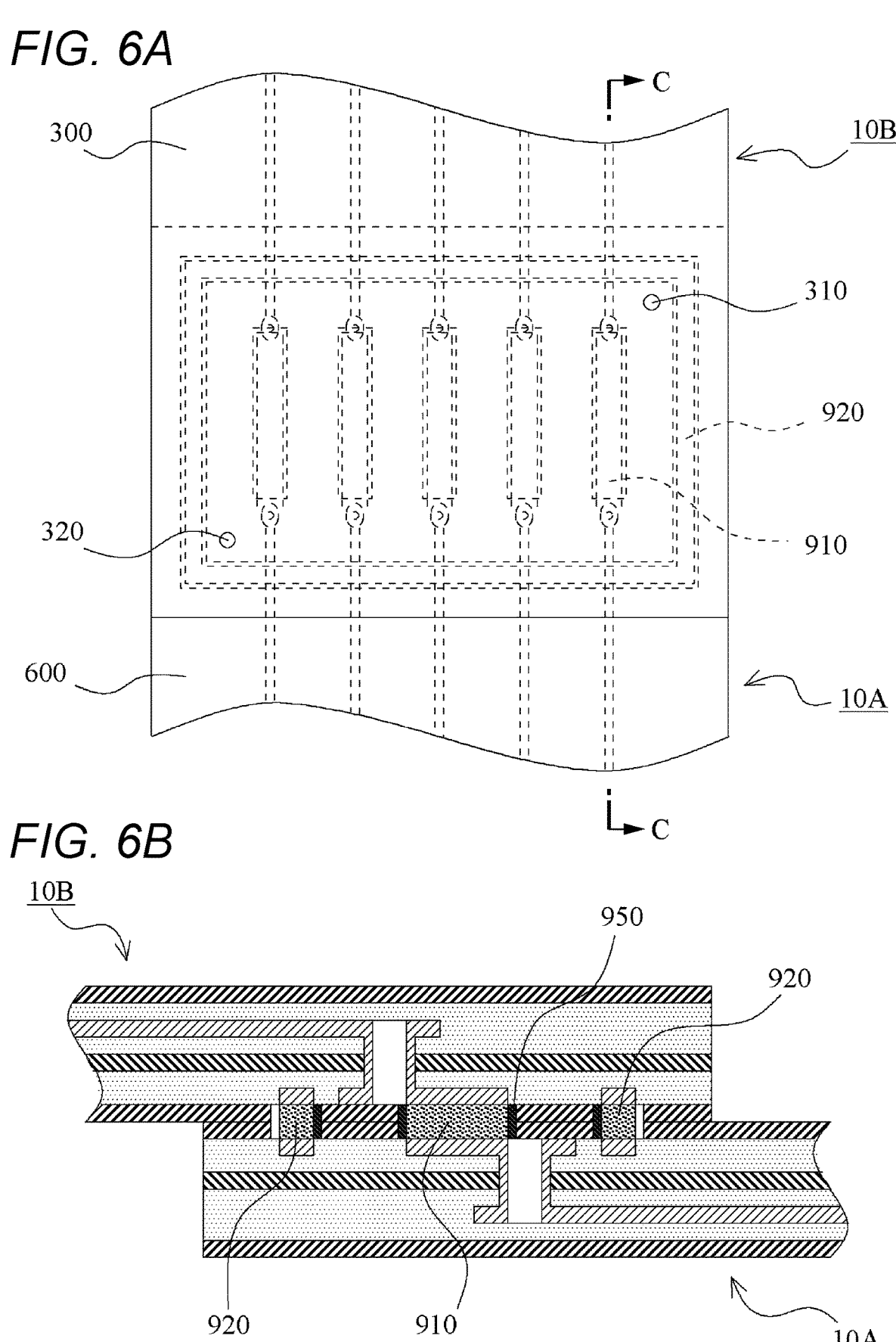
FIGS. 6A and 6B are schematic configuration diagrams of a flexible printed circuit connection structure according to a second embodiment of the present disclosure.

FIG. 6 are schematic configuration diagrams of an FPC connection structure according to the second embodiment of the present disclosure. FIG. 6A is a part of a plan view of the FPC connection structure, and FIG. 6B is a cross-sectional view taken along the line CC of FIG. 6A. Noe that main components are illustrated in perspective with dotted lines.

In this embodiment, holes 310 and 320 leading into the sealed space are provided at two positions of the first coverlay 300 in one of the first FPC 10A and the second FPC 10B (here, the second FPC 10B). By injecting underfill resin through one of the two holes 310 and 320 by using an injection tool or the like, the sealed space can be filled with the underfill resin. A gas in the sealed space is discharged from the other of the two holes 310 and 320 as the sealed space is filled with the underfill resin. Therefore, the sealed space is filled with underfill resin 950. The configurations other than the two holes 310 and 320 and the underfill resin 950 are the same as those of the first embodiment.

According to this embodiment, it is possible not only to obtain the effects of the first embodiment, but also to more reliably prevent short circuits between adjacent wires.

(Third Embodiment)

Figure 7A:
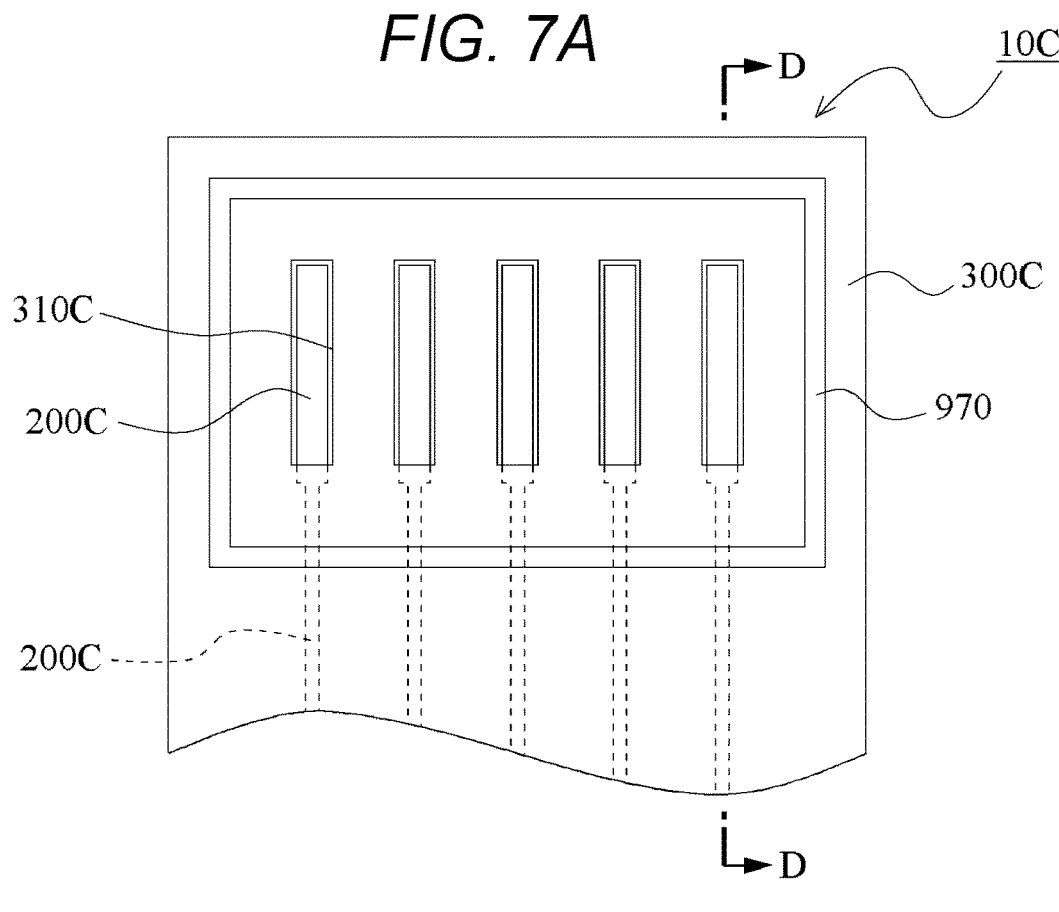
FIGS. 7A to 7C are explanatory diagrams of a flexible printed circuit connection structure according to a third embodiment of the present disclosure.
Figure 7B:
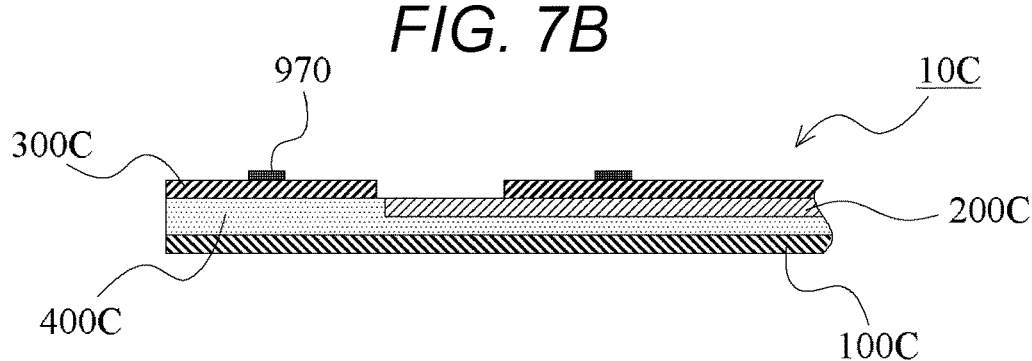
Figure 7C:
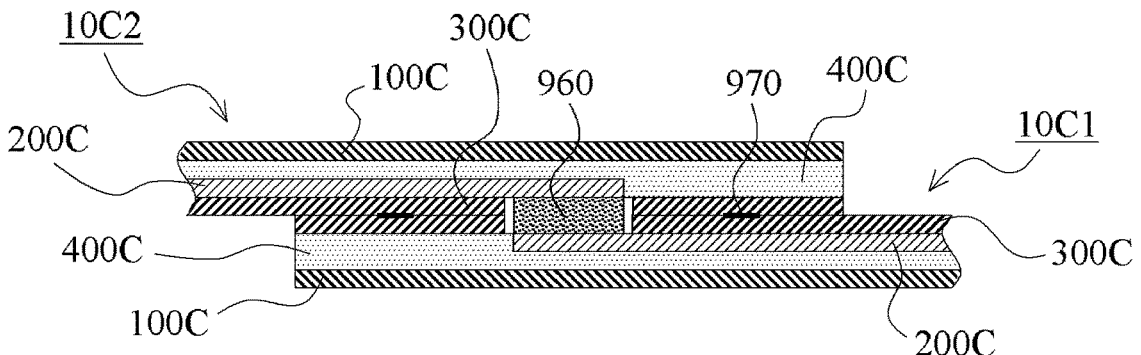

FIG. 7 show a third embodiment of the present disclosure. In this embodiment, an adhesive or double-sided tape is adopted as a partition wall. FIG. 7 are explanatory diagrams of an FPC connection structure according to the third embodiment of the present disclosure. FIG. 7A is a part of a plan view of an FPC, FIG. 7B is a cross-sectional view taken along the line DD of FIG. 7A, and FIG. 7C is a cross-sectional view of the FPC connection structure. Note that main components are illustrated in perspective with dotted lines.

<FPC 10C>

The above first and second embodiments show a case of using a so-called double-sided FPC. Meanwhile, this embodiment shows a case of using a single-sided FPC.

The FPC 10C includes a base film 100C, a plurality of conductor portions 200C arranged on one surface side of the base film 100C, and a coverlay 300C that protects the plurality of conductor portions 200C. The coverlay 300C is connected to the conductor portions 200C and the base film 100C by an adhesive layer 400C. Note that the desired conductor portions 200C are formed by etching a metallic foil such as a copper foil.

The FPC 10C according to this embodiment is a single-sided FPC, and thus wire is formed only by the conductor portions 200C. A plurality of wires is provided in the FPC 10C. In FIG. 7A, five wires are provided.

The coverlay 300C has openings 310C for exposing a part of each of the plurality of conductor portions 200C.

The base film 100C and the coverlay 300C can be made from polyimide, polyethylene naphthalate, polyethylene terephthalate, and the like.

<Connection Structure of FPCs 10C>

A method of increasing the length by connecting the plurality of FPCs 10C formed as described above will be described. Here, for convenience, two FPCs to be connected will be referred to as a first FPC 10C1 and a second FPC 10C2. Note that the first FPC 10C1 and the second FPC 10C2 have at least the same configuration related to connecting (configuration in FIGS. 7A and 7B), and the conductor portions 200C have the same arrangement and width dimensions, and the openings 310C have the same arrangement and dimensional shapes.

First, for example, solder paste is applied to each exposed portion of the plurality of conductor portions 200C in the first FPC 10C1. Then, an adhesive is applied to the first FPC 10C1 so as to surround each exposed portion of the plurality of conductor portions 200C, or a double-sided tape is attached to the first FPC 10C1. Then, the first FPC 10C1 and the second FPC 10C2 are overlaid on each other such that each exposed portion of the plurality of conductor portions 200C in the first FPC 10C1 is placed on each exposed portion of the plurality of conductor portions 200C in the second FPC 10C2. Thereafter, the first FPC 10C1 and the second FPC 10C2 are soldered by being heated while being applied with pressure by a heater tool. Note that soldering may be so-called reflow soldering that is performed by heating a soldering portion in a reflow oven while applying pressure to the soldering portion by using a load applying jig. Therefore, the plurality of conductor portions 200C in the first FPC 10C1 and the plurality of conductor portions 200C in the second FPC 10C2 are connected to each other by solder 960 (see FIG. 7C). Further, the first FPC 10C1 and the second FPC 10C2 are connected by the adhesive or double-sided tape. The adhesive or double-sided tape form a partition wall 970. In FIGS. 7A and 7B, the adhesive or double-sided tape serving as the partition wall 970 later is denoted by the reference sign 970.

The partition wall 970 is provided away from a plurality of solder connection portions where a plurality of wires to be connected (one of the wires of the first FPC 10C1 and the second FPC 10C2 in this embodiment) and a plurality of wires (the other of the wires of the first FPC 10C1 and the second FPC 10C2 in this embodiment) are connected to each other by solder 960 so as to surround the plurality of solder connection portions (see FIG. 7A). In this embodiment, the solder connection portions correspond to parts where the conductor portions 200C in the first FPC 10C1 and the conductor portions 200C in the second FPC 10C2 are connected by the solder 960. Further, a board to be connected (one of the first FPC 10C1 and the second FPC 10C2 in this embodiment), an FPC (the other of the first FPC 10C1 and the second FPC 10C2 in this embodiment), and the partition wall 970 define a sealed space in which the plurality of solder connection portions is arranged.

In the connection structure of the FPCs 10C according to this embodiment formed as described above, the strength of the partition wall 970 is lower than that of the first embodiment, but it is possible to obtain a similar effect to that of the first embodiment. Further, a single-sided FPC is adopted in this embodiment, which makes it possible to reduce the cost, as compared with the first embodiment. Note that this embodiment, as well as the second embodiment, can also adopt a configuration in which the inside of the sealed space is filled with the underfill resin 950.

In each of the above embodiments, a structure for connecting FPCs has been described. However, the FPC connection structure according to the present disclosure is also applicable to a structure for connecting an FPC and a circuit board other than the FPC, such as a rigid circuit board. That is, the present disclosure is applicable to a connection structure in which the wires of the FPC formed as described above and a plurality of wires (a plurality of wires to be connected) provided on various circuit boards are connected by solder.

When the first FPC 10A is a first circuit board, the second FPC 10B is a second circuit board, the wire of the first FPC 10A is first wire, and the wire of the second FPC 10B is second wire, at least one of the first circuit board and the second circuit board needs to be an FPC in the FPC connection structure according to the present disclosure. Further, the solder connection portion corresponds to a part where the second conductor portion 510 of the first wire in the first circuit board and the second conductor portion 510 of the second wire in the second circuit board are connected by the solder 910.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A flexible printed circuit connection structure comprising:

a first flexible printed circuit and a second flexible printed circuit connected to the first flexible printed circuit, wherein each of the first flexible printed circuit and the second flexible printed circuit includes:

a base film;

a plurality of first conductor portions arranged on a first surface side of the base film;

a first adhesive layer disposed on the base film on a second surface side of the base film opposite of the first surface side;

a plurality of second conductor portions arranged on the first adhesive layer;

a through hole through the base film via which the plurality of first conductor portions are connected to the plurality of second conductor portions to form a plurality of wires of the flexible printed circuit connection structure;

a plurality of third conductor portions arranged on the first adhesive layer, the plurality of third conductor portions including a first outer conductor portion being spaced apart from the plurality of second conductor portions in a longitudinal direction of the flexible printed circuit connection structure towards a first end of the flexible printed circuit connection structure and a second outer conductor portion being spaced apart from the plurality of second conductor portions in the longitudinal direction of the flexible printed circuit connection structure towards a second end of the flexible printed circuit connection structure opposite of the first end of the flexible printed circuit connection structure; and a coverlay disposed on the first adhesive layer, the coverlay including a plurality of openings that expose the plurality of second conductor portions and the plurality of third conductor portions; and a bonding agent applied to the plurality of second conductor portions and the plurality of third conductor portions of the first flexible printed circuit and the second flexible printed circuit, wherein the coverlay of the first flexible printed circuit is overlaid on the coverlay of the second flexible printed circuit, and in a configuration in which the coverlay of the first flexible printed circuit is overlaid on the coverlay of the second flexible printed circuit:

a plurality of solder connection portions is formed by the bonding agent applied to the plurality of second conductor portions of the first flexible printed circuit and the second flexible printed circuit, and a partition wall is formed by the bonding agent applied to the plurality of third conductor portions of the first flexible printed circuit and the second flexible printed circuit, the partition wall surrounding the plurality of solder connection portions to seal the plurality of solder connection portions inside a sealed space formed by the partition wall, the coverlay of the first flexible printed circuit, and the coverlay of the second flexible printed circuit.

2. The flexible printed circuit connection structure according to claim 1, wherein the bonding agent is solder.

3. The flexible printed circuit connection structure according to claim 1, wherein the bonding agent is an adhesive or double-sided tape.

4. The flexible printed circuit connection structure according to claim 1, wherein the coverlay includes a plurality of holes, and in the configuration in which the coverlay of the first flexible printed circuit is overlaid on the coverlay of the second flexible printed circuit, an inside of a sealed space is filled with underfill resin via the plurality of holes.

5. The flexible printed circuit connection structure according to claim 1, wherein each of the first flexible printed circuit and the second flexible printed circuit further comprises:

a second adhesive layer disposed on the base film on the first surface side of the base film; and a second coverlay disposed on the second adhesive layer.

6. The flexible printed circuit connection structure according to claim 5, wherein the plurality of first conductor portions, the plurality of second conductor portions, and the plurality of third conductor portions is formed by etching a metallic foil.

7. The flexible printed circuit connection structure according to claim 6, wherein the metallic foil is a copper foil.

* * * * *